(12) United States Patent
Houston

(10) Patent No.: US 6,635,550 B2
(45) Date of Patent: Oct. 21, 2003

(54) SEMICONDUCTOR ON INSULATOR DEVICE ARCHITECTURE AND METHOD OF CONSTRUCTION

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/001,473

(22) Filed: Nov. 1, 2001

(65) Prior Publication Data

US 2002/0079537 A1 Jun. 27, 2002

Related U.S. Application Data

(60) Provisional application No. 60/257,326, filed on Dec. 20, 2000.

(51) Int. Cl.[7] .............................................. H01L 21/76
(52) U.S. Cl. ...................... 438/406; 438/405; 438/406; 438/403; 438/428; 438/381

(58) Field of Search ................................. 438/403, 405, 438/406, 428, 479, 381; 257/508, 531, 753, 754, 758

(56) References Cited

U.S. PATENT DOCUMENTS

| 5,536,361 A | * | 7/1996 | Kondo et al. ............... 438/492 |
| 6,255,731 B1 | * | 7/2001 | Ohmi et al. ................ 257/758 |
| 2003/0075776 A1 | * | 4/2003 | Ohkubo et al. ............. 257/531 |

* cited by examiner

*Primary Examiner*—George Fourson
*Assistant Examiner*—Julio J. Maldonado
(74) *Attorney, Agent, or Firm*—Yingsheng Tung; Wade James Brady, III; Frederick J. Telecky, Jr.

(57) ABSTRACT

An SOI architecture is provided that comprises an inner substrate 10 which has a buried conductor layer 12 formed on an outer surface thereof. A bonding layer 14 is used to provide a cohesive bond with a buried insulator layer 18. The semiconductor device layer 20 is formed on the outer surface of buried insulator layer 18. An inductive well 22 can be formed to provide a platform for the formation of inductive devices 34 within an inductive region 26.

4 Claims, 2 Drawing Sheets

SEMICONDUCTOR ON INSULATOR DEVICE ARCHITECTURE AND METHOD OF CONSTRUCTION

This application claims priority under 35 USC §119(e)(1) of provisional application No. 60/257,326 filed Dec. 20, 2000.

TECHNICAL FIELD OF THE INSTITUTION

This invention relates in general to the field of electronic devices and, more particularly, to an improved architecture and method of construction for semiconductor on insulator devices.

BACKGROUND OF THE INVENTION

In a wide variety of applications, integrated electronic devices can be formed in a semiconductor layer which is disposed outwardly from a buried insulator layer. This architecture is commonly referred to as semiconductor on insulator or "SOI" architecture SOI architectures are used in a wide variety of digital, power and RF applications. The buried insulator layer typically comprises a layer of oxide which allows for integrated architectures and especially isolation techniques that are not available in conventional integrated system architectures that are built on monolithic semiconductor substrates.

SOI structures are typically formed using two separate substrates which are bonded together before the device grade semiconductor material is exposed. The ability to form a cohesive and durable bond between the two substrates prior to processing the device layer is critical to the overall practicality of the device. If the bond is subject to delamination for any reason, the reliability of the entire system is degraded.

SUMMARY OF THE INVENTION

Accordingly, a need has arisen for an SOI architecture that provides for a cohesive substrate to substrate bond. In accordance with the teachings of the present invention, an SOI architecture is provided that allows a cohesive substrate bond that includes the capability to form buried conductive layers within the SOI architecture.

According to one embodiment of the present invention, a method of forming a electronic device is described which comprises forming a buried conductive layer. A layer of semiconductor material is then deposited outwardly from the buried conductive layer. The outer surface of the semiconductor layer can then be bonded to an outer substrate. The bonded architecture can then be processed to expose a device semiconductor layer.

An important technical advantage of the present invention inheres in the fact that the SOI architecture disclosed provides for a buried conductive layer but still provides for a cohesive bond between the buried substrate and the outer device layers associated with the bonded substrate.

According to an alternate embodiment of the present invention, a trench can be formed through the outer layers penetrating into the inner substrate through the buried conductor layer. This trench can then be filled with dielectric material. In this manner, conductive devices can be formed on the outer surface of the dielectric layer which defines a low-loss region. Other active devices which benefit from the buried conductor layer can be formed in non-low-loss regions of the outer surface of this integrated system.

BRIEF DESCRIPTION OF THE DRAWINGS

A more complete understanding of the present invention and the advantages thereof may be acquired by referring to the accompanying figures in which like reference numbers indicate like features and wherein.

DETAILED DESCRIPTION OF THE DRAWINGS

Figure 1A:
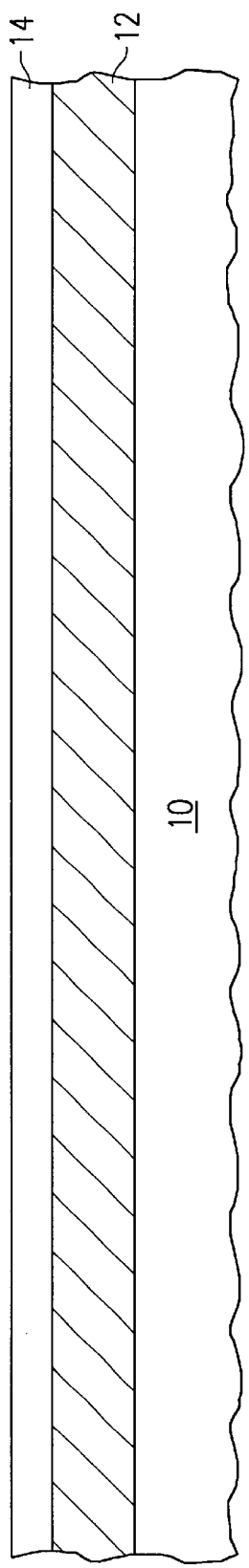
FIGS. 1A through 1C are sequential, cross-sectional, elevational diagrams illustrating an SOI architecture and a method of forming the same according to the teachings of the present invention.

Referring to FIG. 1A, an inner substrate 10 is shown which may comprise, for example, single crystalline silicon or other suitable semiconductor material such as gallium arsenide or the equivalent. Inner substrate 10 may have a variety of different conductivity characteristics depending upon the necessary application. As will be described herein, one potential application of the architecture of the present invention involves the formation of inductive and non-inductive regions in an RF device architecture. In this application, semiconductor substrate 10 may have a fairly high resistivity on the order of 500Ω-cm or greater. For more conventional architectures which require the inner substrate 10 to be used as a contact point for device voltages, substrate 10 may have a much lower resistivity on the order of 20Ω-cm.

Referring again to FIG. 1A, a buried conductive layer 12 is deposited on the outer surface of substrate 10. Buried conductive layer 12 may comprise a unitary layer of a conductive material such as a layer of tungsten deposited to a depth on the order of 5000 Angstroms or a layer of titanium nitride deposited to a depth on the order of 3000 to 4000 Angstroms. If layer 12 is a unitary sheet of conductive material, it comprises a conductive plane underlying the entire device layer. In this manner, the buried conductive layer 12 can be used to communicate supply voltages to the entirety of an integrated device. In addition, the conductive layer 12 can be used to shield one portion of an integrated device from electric fields created by inductive devices in other portions of an integrated device. The buried conductive layer 12 also acts as a diffusion barrier which allows for the separation of the doped substrate from intrinsic semiconductor materials disposed outwardly from buried conductive layer 12.

According to an alternate embodiment of the present invention, conductive layer 12 may comprise a layer of conductive interconnects which serve to connect various active devices which will be formed in later process steps. According to this embodiment, conductive layer 12 may be deposited as a single layer of conductive material and then patterned and etched using conventional photolithographic processes to form the required interconnect structures. The teachings of the present invention provide for a cohesive bond between the inner substrate 10 and the outer substrate to be described herein regardless of whether conductive layer 12 is a unitary structure or a mesh of conductive interconnects.

Referring to FIG. 1A, a semiconductor bonding layer 14 is deposited outwardly from the outer surface of buried conductive layer 12. Bonding layer 14 may comprise, for example, a layer of amorphous, intrinsic silicon which is deposited to a depth on the order of 1000 Angstroms. Because layer 14 is left undoped as intrinsic silicon, layer 14 will act as an insulator and will not affect the performance of any interconnections formed in layer 12.

Figure 1B:
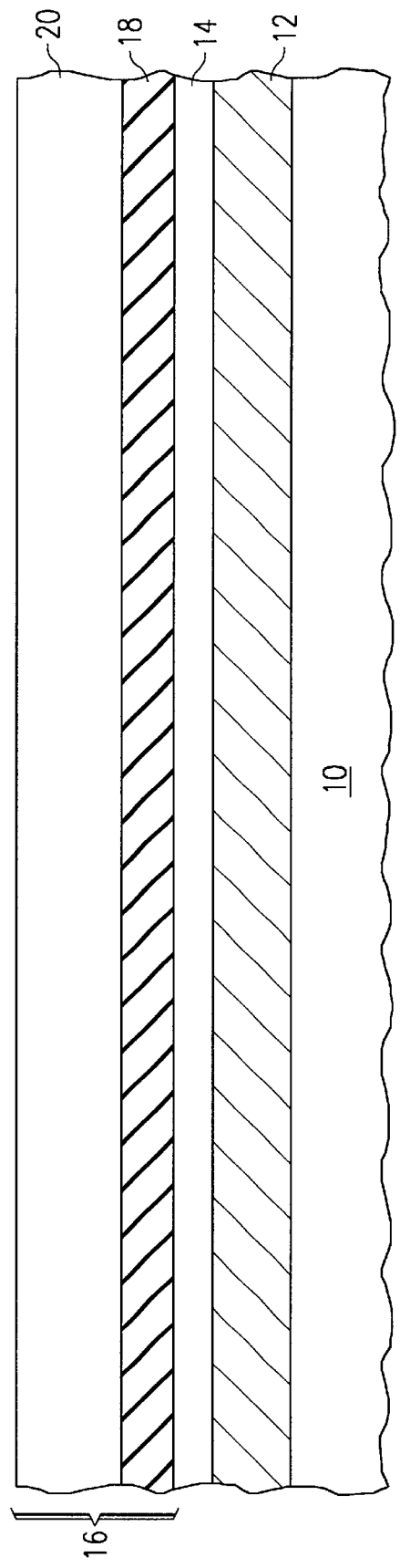

Referring to FIG. 1B, the SOI architecture is illustrated following the bonding of the outer substrate to the inner substrate 10 and following the exposure of a device semiconductor layer. FIG. 1B illustrates an outer substrate 16 which comprises a buried insulator layer 18 and a device layer 20. Buried insulator layer 18 may comprise, for example, on the order of 1000 Angstroms of silicon dioxide. Device layer 20 may comprise, for example, on the order of 2000 Angstroms of single crystalline silicon. Layer 18 and the outer layer of layer 14 are bonded together using conventional SOI processes. Following this bonding process the outer surface of layer 20 is exposed and planerized. Suitable SOI processes that can be used to bond the two substrates and to expose layer 20 comprise the Smart Cut process developed by LETI and the Soitec Company and the Eltran process developed by Canon, Incorporated.

The placement of bonding layer 14 provides an important advantage of having the bond between the two substrates be a silicon to silicon dioxide bond. This provides for a very cohesive and effective bond for the overall device. As such, a cohesive bond is provided in an architecture which also includes a buried conductive layer 12 which can act as a conductive plane or an additional layer of interconnect structures.

Figure 1C:
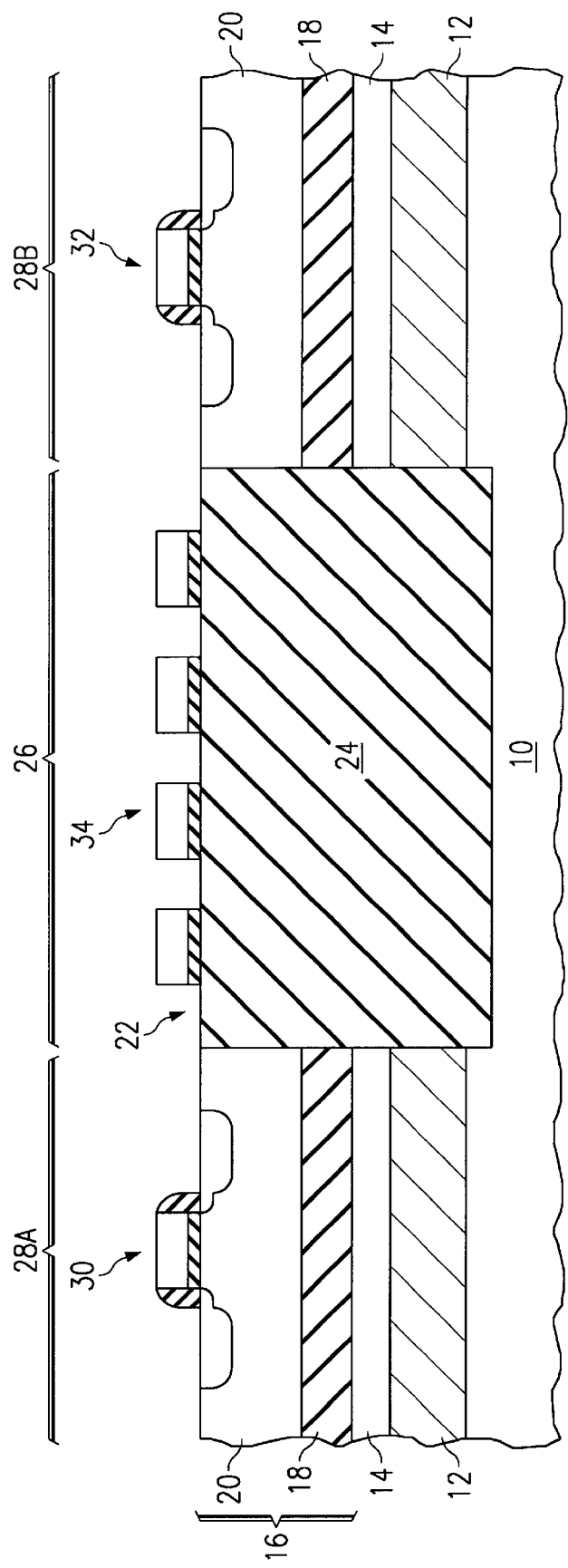

FIG. 1C illustrates a particular application of the SOI architecture of the present invention. In FIG. 1C a trench indicated generally at 22 is etched into the outer surface of the SOI structure. Trench 22 passes through device layer 16, buried insulator layer 18, bonding layer 14, and buried conductor layer 12 and somewhat into the substrate layer 10. Trench 22 is then filled with an insulative material such as silicon dioxide and the entire device is then planerized to form insulator well 24 as shown in FIG. 1C. Insulator well 24 defines low-loss region 26 which is distinguished from non-low-loss active regions 28a and 28b which abut the periphery of low-loss region 26. According to the teachings of this embodiment of the present invention, active regions 28a and 28b serve as sites for active devices such as a field effect transistor indicated generally at 30 and a second field effect transistor indicated. generally at. 32 shown in FIG. 1C. In comparison, low-loss region 26 serves as a site for the formation of a spiral inductor indicated generally at 34. Inductor 34 will typically be separated from the outer surface of region 26 by a suitable layer of insulative material such as oxide or nitride.

FIG. 1C therefore clearly illustrates the advantages of the ability to closely juxtapose inductive and non-inductive devices. The SOI architecture of the present invention allows for the active regions 28a and 28b to serve as sites for field effect devices 30 and 32 which benefit greatly from the underlying buried conductive layer 12. The buried conductive layer 12 provides for excellent thermal conductivity away from the devices 30 and 32. In addition, the buried conductor layer 12 provides shielding from the electronic fields associated with the inductive device 34 which may disrupt the operation of the devices 30 and 32. In contrast, the inductive device 34 formed in low-loss region 26 is formed in an area of the SOI architecture which does not have buried conductor 12 underlying it. In this manner, the field lines associated with the inductive device 34 do not intersect the buried conductor 12 which would result in the formation of parasitic currents which would degrade the performance of the device. It should be understood that the use of the field effect devices 30 and 32 and the spiral inductor 34 are solely presented for purposes of teaching advantages of the present invention which would be equally applicable if other active non-inductive devices and inductive devices or inactive structures such as transmission lines were presented.

According to the embodiment shown in FIG. 1C, the buried conductive layer 12 can be used as a continuous conductive plane underlying non-low-loss regions of the device or, as described previously, buried conductive layer 12 may be used as another level of interconnects which can similarly be removed from areas of the device underlying inductive structures. If layer 12 is used as a continuous plane, it will be in direct contact with substrate 10. Alternatively, if layer 12 is used as a network of interconnects, isolation structures such as layers of oxide or nitride would be used to separate layer 12 from substrate 10.

According to one embodiment of the present invention, buried conductive layer 12 may be used as a medium to communicate a supply voltage to the entire device. According to this embodiment of the present invention, substrate 10 may have a relatively low resistivity of on the order of 20Ω-cm. Alternatively, the resistivity of substrate 10 could be set relatively high at greater than 500Ω-cm and topside contacts could be made to buried conductive layer 12 to provide for supply voltage contacts. The ability to use a high resistivity material for substrate 10 allows for further performance gains for devices formed in inductive region 26. As can be seen in FIG. 1C, the field lines associated with the inductive device 34 pass through the insulative well 24 and into the substrate 10. As such, the higher the resistivity of the substrate 10 the lower the parasitic current losses will be during operation of device 34.

Although the present invention has been described in detail, it should be understood that various changes, alterations, substitutions and modifications may be made to the teachings described herein without departing from the spirit and scope of the present invention which is solely defined by the appended claims.

What is claimed is:

1. A method of forming an electronic device comprising:
   providing an inner semiconductor substrate;
   forming a buried conductive layer on the outer surface of the inner substrate;
   forming a semiconductive bonding layer on an outer surface of the buried conductive layer;
   bonding an outer substrate to the outer surface of the bonding layer, the outer substrate comprising a buried insulator layer having a surface bonded to the outer surface of the bonding layer, the outer substrate further comprising a semiconductive device layer disposed outwardly from the buried insulator layer; and
   forming an insulator well defining an inductive region, the insulator well comprised of an insulative material and disposed in a trench formed in the electronic device such that the insulative material of the insulator well is in contact with the inner substrate, the buried conductive layer, the bonding layer, the buried insulator layer, and the device layer.

2. The method of claim 1 and further comprising, forming an inductive device on an outer surface of the insulator well.

3. The device of claim 1 wherein the inner substrate comprises a semiconductor material having a resistivity about greater than or equal to 500Ω-cm.

4. The method of claim 1 and further comprising:
   forming active non-inductive devices proximate the outer surface of the device layer proximate the borders of the insulative well.

* * * * *